United States Patent
Bodnar et al.

(10) Patent No.: US 10,707,889 B1
(45) Date of Patent: Jul. 7, 2020

(54) INTERLEAVING METHOD FOR ANALOG TO DIGITAL CONVERTERS

(71) Applicant: Analog Devices International Unlimited Company, Limerick (IE)

(72) Inventors: Rares Andrei Bodnar, Berkshire (GB); Christopher Peter Hurrell, Cookham (GB); Asif Ahmad, Newbury (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/410,945

(22) Filed: May 13, 2019

(51) Int. Cl.
    *H03M 1/12* (2006.01)
    *H03M 1/46* (2006.01)
(52) U.S. Cl.
    CPC ......... *H03M 1/1215* (2013.01); *H03M 1/124* (2013.01); *H03M 1/46* (2013.01)
(58) Field of Classification Search
    CPC ....... H03M 1/1215; H03M 1/46; H03M 1/124
    USPC ........................................ 341/155, 161, 172
    See application file for complete search history.

(56) References Cited

U.S. PATENT DOCUMENTS

| | | | |
|---|---|---|---|
| 6,956,517 B1 | 10/2005 | Baker et al. | |
| 7,015,842 B1 | 3/2006 | Gupta et al. | |
| 7,843,373 B2 | 11/2010 | Carreau | |
| 8,436,759 B2* | 5/2013 | Doris | H03M 1/0614 341/155 |
| 8,599,051 B2 | 12/2013 | Yoshida et al. | |
| 9,088,293 B1 | 7/2015 | D Souza et al. | |
| 9,112,521 B2 | 8/2015 | Dedic et al. | |
| 9,294,112 B1 | 3/2016 | Devarajan et al. | |
| 9,363,022 B2 | 6/2016 | Aoki | |
| 9,584,144 B1 | 2/2017 | Zhou et al. | |
| 9,608,652 B2 | 3/2017 | Lee et al. | |
| 9,660,662 B2 | 5/2017 | Venca et al. | |
| 9,793,910 B1 | 10/2017 | Devarajan | |
| 2001/0052864 A1* | 12/2001 | Shimizu | H03M 1/0673 341/141 |

OTHER PUBLICATIONS

El-Chammas, Manar, et al., "A 12-GS/s 81-mW 5-bit Time-Interleaved Flash ADC with Background Timing Skew Calibration", IEEE Symposium on VLSI Circuits/Technical Digest of Technical Papers, (2010), 2 pgs.

Louwsma, S. M., et al., "Chapter 2: Time-interleaved Track and Holds", Time-interleaved Analog-to-Digital Converters, Springer, (2011), 35 pgs.

* cited by examiner

*Primary Examiner* — Khai M Nguyen
(74) *Attorney, Agent, or Firm* — Schwegman Lundberg & Woessner, P.A.

(57) ABSTRACT

An electronic circuit comprises multiple analog-to-digital converter (ADC) circuits and control logic circuitry. The control logic circuitry advances the multiple ADC circuits through multiple time-interleaved conversions that include time-interleaved acquisition phases, conversion phases, and tracking phases. An acquisition phase of a first ADC circuit samples the analog signal, a conversion phase of the first ADC circuit converts the sampled analog signal to a digital value, and the control logic circuitry is configured to update the first ADC circuit with most recent A/D conversion information by a different ADC circuit during a tracking phase of the first ADC circuit before the acquisition phase of the first ADC circuit.

24 Claims, 6 Drawing Sheets

INTERLEAVING METHOD FOR ANALOG TO DIGITAL CONVERTERS

BACKGROUND

Electronic systems can include analog-to-digital (A/D) converters (ADCs). Converting analog signals to digital quantities allow processors of electronic systems to perform signal processing functions for the systems. ADC circuits can exhibit noise due to kickback. Kickback is when residual charge on sample and hold structures of an ADC circuit flows back toward the input during a sampling phase of the A/D conversion. Kickback can lead to inaccuracies in the conversion results. The present inventors have recognized a need for improved ADC circuits.

OVERVIEW

This document relates generally to analog-to-digital converter (ADC) circuits, and in particular to improvements in the interleaved operation of ADC circuits. An example ADC circuit includes multiple analog-to-digital converter (ADC) circuits and control logic circuitry. The control logic circuitry advances the multiple ADC circuits through multiple time-interleaved conversions that include time-interleaved acquisition phases, conversion phases, and tracking phases. An acquisition phase of a first ADC circuit samples the analog signal, a conversion phase of the first ADC circuit converts the sampled analog signal to a digital value, and the control logic circuitry is configured to update the first ADC circuit with most recent A/D conversion information by a different ADC circuit during a tracking phase of the first ADC circuit before the acquisition phase of the first ADC circuit.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The rate of analog-to-digital (A/D) conversions can be increased by interleaving the conversions of multiple ADC circuits. For example, a first ADC circuit can be performing a conversion while a second ADC circuit is sampling the input. This eliminates the sampling time from the time conversion. More than two ADC circuits can be interleaved with the phases of each of the multiple ADC circuits staggered with the phases of the other ADC circuits to create a conversion "pipeline" in which a conversion result is produced faster than the conversion rate of any one ADC circuit. However, interleaving A/D conversions can lead to problems with noise and inaccuracies in results.

Figure 1:
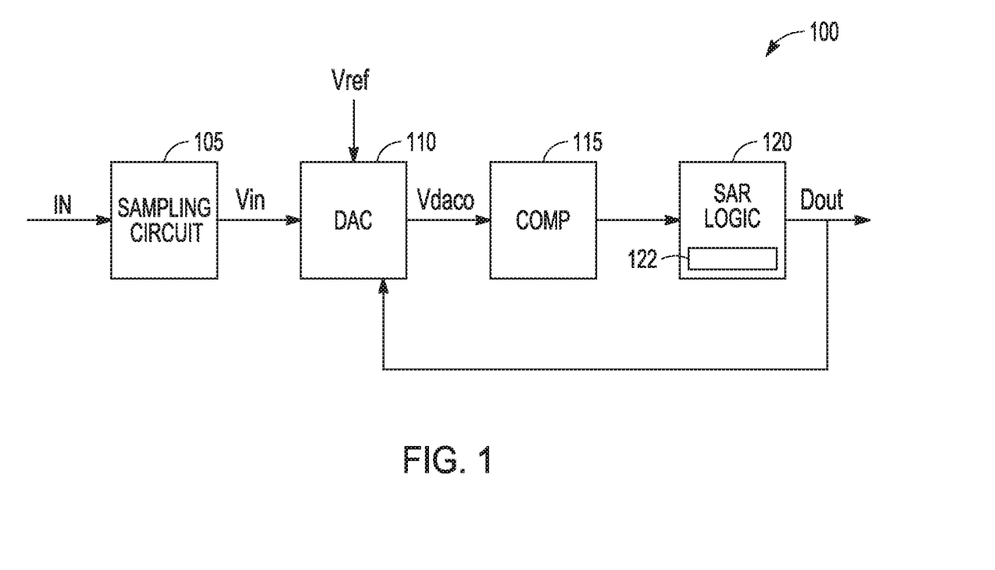
FIG. 1 is a functional block diagram of an example of a successive approximation register analog-to digital converter (SAR ADC) circuit.

FIG. 1 is a functional block diagram of an example of a successive approximation register (SAR) ADC circuit 100. The SAR ADC circuit includes a digital-to-analog converter (DAC) circuit 110, a sampling circuit 105 that may be included in the DAC circuit 110, a comparator circuit 115, and logic circuitry 120.

The DAC circuit 110 includes at least M weighted circuit components, M being a positive integer. In certain examples, M is equal to sixteen and the weighted circuit components include sixteen capacitors. The sampling circuit 105 samples an input voltage at an input to the ADC circuit and holds a sampled voltage for comparison to the weighted circuit components. In certain examples, the DAC circuit 110 is a differential DAC circuit and a differential analog voltage is sampled and converted.

An output voltage of the DAC circuit 110 (Vdaco) is compared to the sampled and held voltage using comparator circuit 115. The bit values of the DAC circuit 110 are adjusted based on the output of the comparator circuit. The conversion may start with the DAC set to midscale. The comparator circuit 115 determines whether the DAC output is greater or less than the sampled input voltage and the result is stored as a one or zero for that bit of the DAC. Conversion then proceeds to the next bit value until all bits of the digital value are determined. One iteration of changing the DAC output and comparing the voltage to the input voltage can be referred to as a bit trial.

The SAR logic circuitry 120 controls the ADC operation during the bit trials. The SAR logic circuitry 120 initiates one sample of the input voltage, initiates the first conversion of the sampled input voltage to a first set of bit values using the bit trials, and initiates a second conversion of the sampled input voltage to a second set of bit values. The logic circuitry can include a digital engine 122 to perform functions such as progressing the ADC through different states of operation and to perform the calculations described. The logic circuitry 120 determines the final M-bit digital value for the sampled input voltage and the final M-bit digital value is available at output Dout.

Figure 2A:
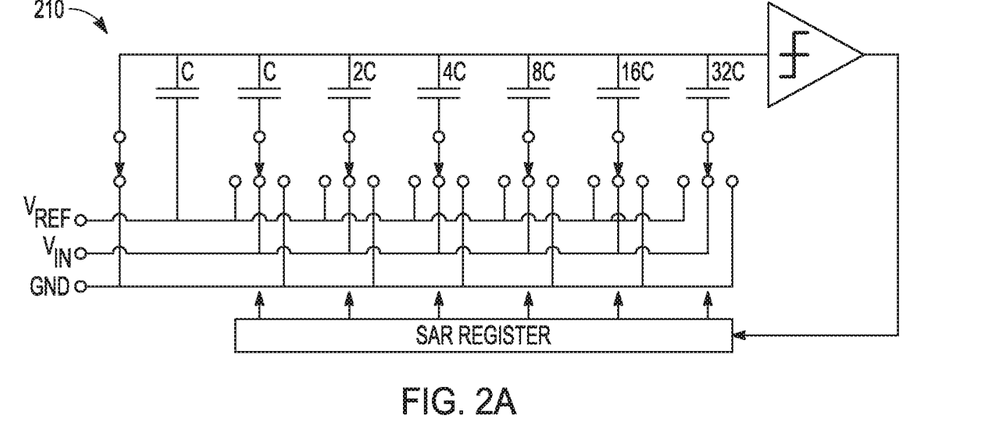
FIGS. 2A-2C are circuit diagrams of portions of an example of a digital-to-analog converter (DAC) circuit of an ADC circuit.
Figure 2B:
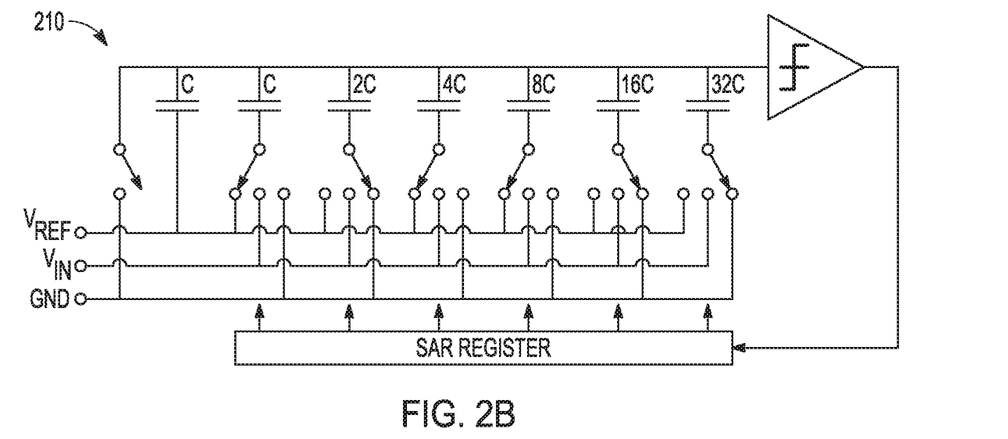
Figure 2C:
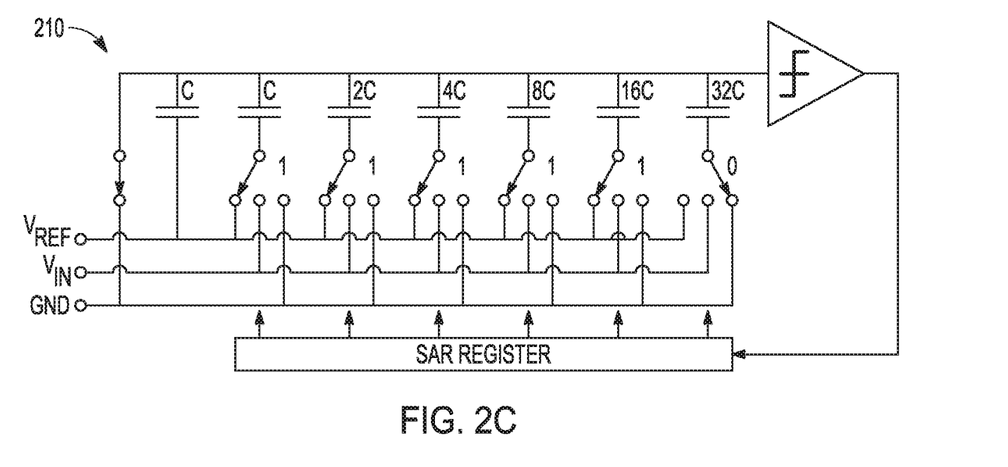

FIGS. 2A-2C are circuit diagrams of portions of an example of a DAC circuit 210 for an eight bit SAR ADC (MA=8). The DAC circuit 210 includes an array of weighted capacitors and includes an array of switches that are configured by logic circuitry for an acquisition or sampling phase, a conversion phase, and a reset phase of the DAC circuit. The DAC circuit in the example of FIG. 2A is shown in the acquisition phase. FIG. 2B shows an example of a DAC circuit during a portion of the conversion phase, and FIG. 2C shows an example of a DAC circuit in the reset phase.

For an SAR DAC circuit there are two traditional approaches with respect to the state which the DAC is set before returning the circuit to the acquisition phase. Which approach is used depends on the frequency of the input signal with respect to the frequency of the sampling by the ADC circuit.

Figure 3:
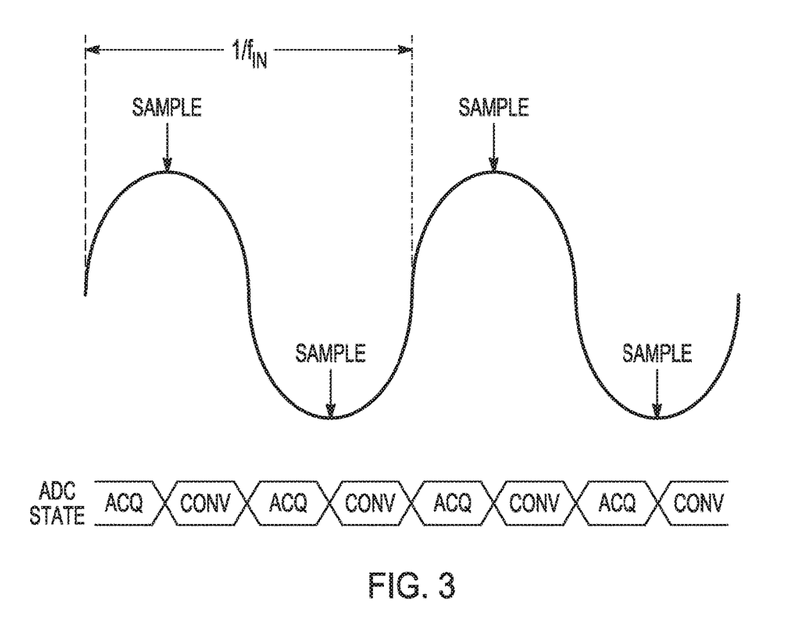
FIG. 3 is an illustration of an example of an input signal to be sampled using an ADC circuit.

FIG. 3 is an illustration of a fast-moving input signal with a frequency equal to one-half of the sampling frequency. This is the maximum frequency of a signal acquired and reconstructed in the digital domain without loosing information, also known as Nyquist frequency of the input signal. Also shown in the Figure is the state of the ADC circuit changing between an acquisition phase (ACQ) and a conversion phase (CONV). The ADC circuit is sampling at the Nyquist frequency with a phase shift of 90 degrees (90°) with respect to the input signal. The capacitive array of the DAC circuit is always reset to mid-scale before returning to the acquisition phase. This is done in order to reduce the load on the ADC driver.

If the capacitive array of the DAC circuit is reset to mid-scale the ADC driving amplifier would need to supply an electrical charge proportional with the current level of the signal: $Q=A*C_{IN}$, where Q is the charge, A is the signal amplitude, and $C_{IN}$ is the input capacitance of the capacitive array of the DAC circuit.

If the reset phase would be missing the charge corresponding to mid-scale, the charge held on the capacitor before returning to acquisition would be a digital representation of the input signal (very close to the signal level). For the Nyquist sampling example above, the driving amplifier would have to supply an electrical charge equal to $Q'=2*A*C_{IN}$ when returning to the acquisition phase. Thus, resetting to mid-scale reduces the kickback associated with sampling after a conversion.

Figure 4A:
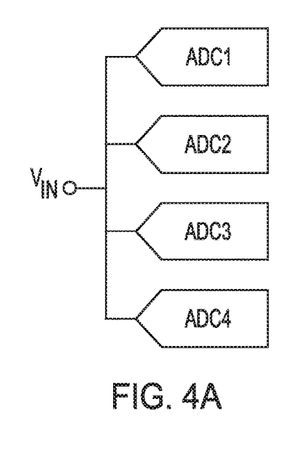
FIG. 4A is a block diagram of an example of four ADC circuits connected in parallel to sample and covert one input signal.

FIG. 4A is a block diagram of an example of four ADC circuits connected in parallel to sample and covert one input voltage $V_{IN}$. The four ADC circuits are time-interleaved and operate as phase shifted parallel A/D converters to provide a 4× decrease in the time needed to complete a conversion. The increase in conversion speed can be useful for fast-moving signals.

Figure 4B:
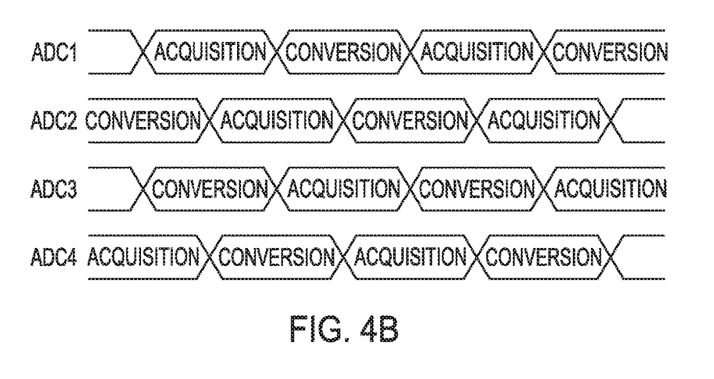
FIG. 4B shows the interleaving of the operating states of the four ADC circuits of FIG. 4A.

FIG. 4B shows the interleaving of the operating states of the four ADC circuits of FIG. 4A. In the example, the four ADC circuits are 90° out of phase (360°/N, where N=4). A disadvantage to the interleaving is that the continuous sequence of the four ADCs can introduce interleaving conversion artifacts due to mismatches between the ADCs. These artifacts can lead to errors in the A/D conversion and occur at $f_{CONV}/N$ or $f_{CONV}/N-f_{IN}$, where $f_{CONV}$ is the conversion frequency, N is the number of ADC circuits, and $f_{IN}$ is the frequency of the input signal $V_{IN}$.

Figure 5A:
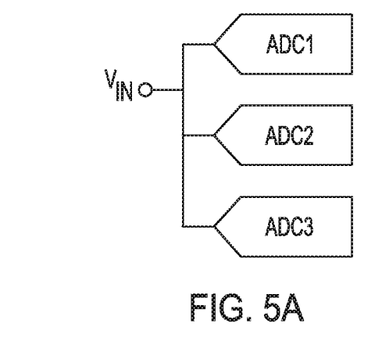
FIG. 5A is a block diagram of an example of three ADC circuits connected in parallel to sample and covert one input signal.
Figure 5B:
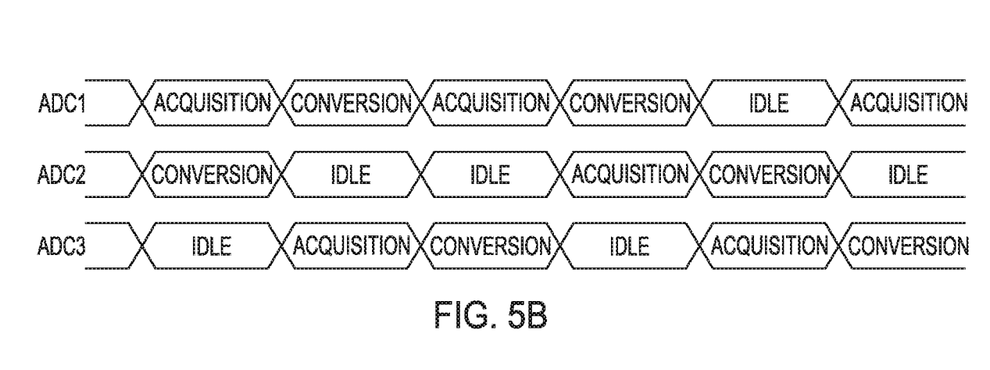
FIG. 5B shows the interleaving of the operating states of the three ADC circuits of FIG. 5A.

FIG. 5A is a block diagram of an example of three ADC circuits connected in parallel to sample and covert one input voltage $V_{IN}$. The three ADC circuits perform interleaving to achieve a 2× increase in conversion speed. FIG. 5B shows the interleaving of the operating states of the three ADC circuits of FIG. 5A. The ADC circuits are 180° out of phase (N=2), and the 2× interleaving can be referred to as ping-pong interleaving.

To reduce or prevent the conversion artifacts, an extra ADC phase referred to as an IDLE phase can be added to the interleaving and the ADC circuits may perform conversions in a randomized order. After a conversion, an ADC circuit enters the IDLE phase where it is held in a reset state (e.g., set to midscale) until it returns to the acquisition phase. Placing the ADC circuits in the reset state is useful because the signals being sampled using interleaving are usually fast-moving signals, and the reset state provides advantage explained previously herein regarding FIG. 3. Placing the ADC circuits in the reset state is useful when randomization is used. The sampled value of the ADC circuit that enters the acquisition phase for the current conversion may be the result from one, two, or three cycles before the current cycle depending on the randomization. This previously sampled value may introduce nonlinear settling of the DAC of the ADC, which can increase the settling error and cause extra noise. Placing an ADC circuit is a reset state before acquisition can reduce the nonlinear settling of the ADC circuit.

Figure 6:
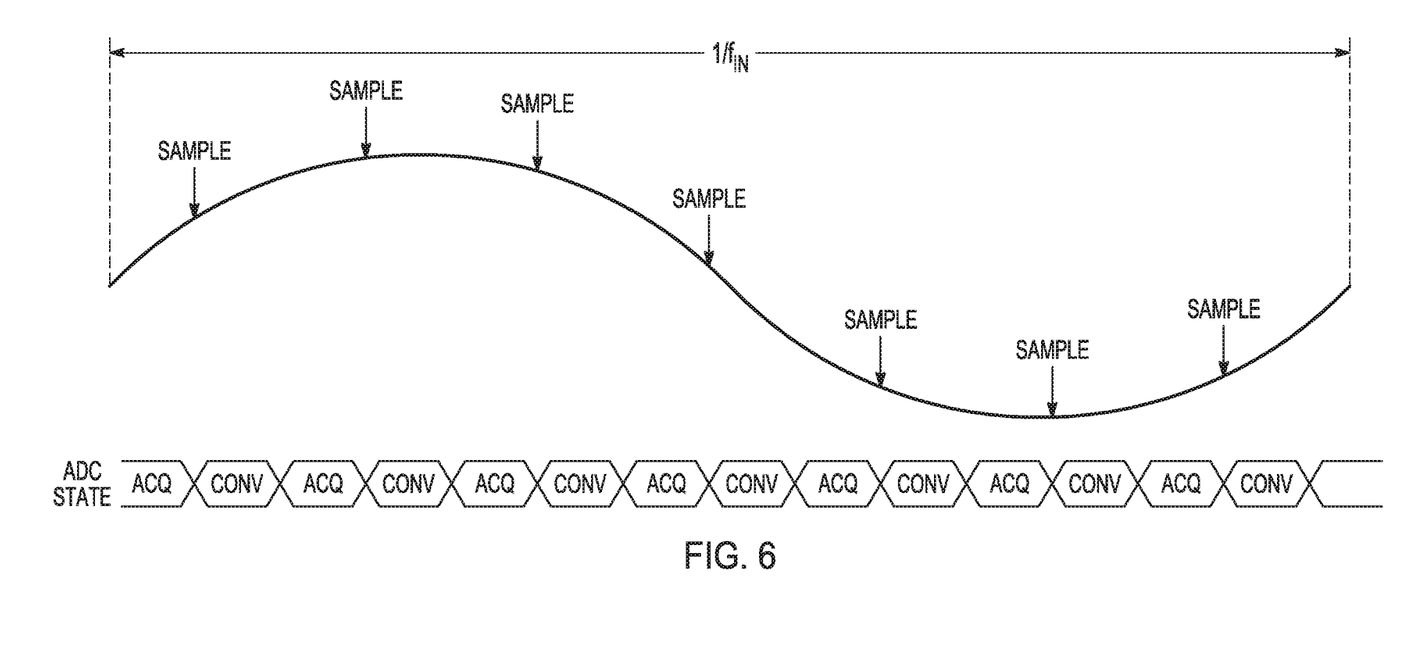
FIG. 6 is an illustration of another example of an input signal to be sampled using an ADC circuit.

FIG. 6 is an illustration of a slow-moving input signal with a frequency less than the sampling frequency. Operating an ADC circuit without a reset phase can be favorable when the signal frequency is small with respect to the sampling frequency. The example in FIG. 6 shows that for the slow signal case the signal variation between two samples by the ADC circuit is always less than the signal amplitude, and the signal variation between two samples is less than mid-scale. Therefore, skipping the reset phase and keeping the voltage after the conversion on the DAC to the digital representation of the signal (approximately the previous sampled level) reduces the kickback compared to resetting the DAC to midscale.

Figure 7:
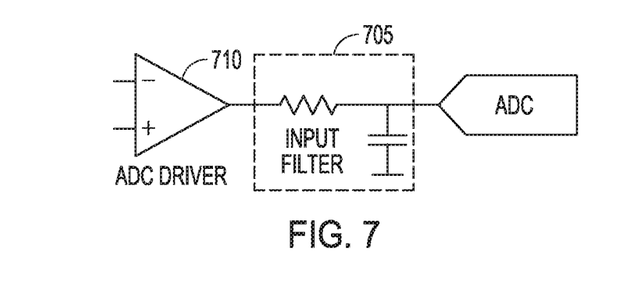
FIG. 7 is a diagram of an example of a filter circuit and driver circuit for an ADC circuit.

FIG. 7 is a diagram of an example of a filter circuit 705 and driver circuit 710 for an ADC circuit. The filter is arranged between the ADC circuit and the driver circuit. Skipping the reset phase is also desirable from the perspective of the filter circuit. The bandwidth needed by the filter circuit is mainly determined by the kickback of the ADC sampling, or the variation between two samples of the input signal. If the ADC circuit is kept to the previous sample rather than midscale, the kickback of the ADC sampling will be smaller allowing the bandwidth of the filter circuit to be smaller. The lower bandwidth reduces the noise bandwidth and increases the signal-to noise ratio (SNR). Skipping the reset phase is also desirable because the driver can be lower power. Because the input to the ADC circuit will settle faster the driver does not need to provide as much current.

However, skipping the reset phase can cause problems in interleaving. As explained previously herein, the ADC circuits used in the 2× interleaving with randomization are reset and held to midscale for the IDLE phase to reduce kickback. Skipping the reset phase may result in the sampled value of the ADC circuit entering the acquisition phase for the current conversion holding a result from one, two, or three cycles before the current cycle depending on the randomization. The IDLE phase is changed from a reset operation to a track operation in which the ADC circuit in the IDLE phase tracks the operation of the ADC circuit in the CONVERSION phase. Thus, when an ADC circuit in the IDLE phase or TRACKING phase goes into the ACQUISITION phase it will hold the signal information from the previous sample, thus minimizing the kickback due to sampling the input.

Figure 8:
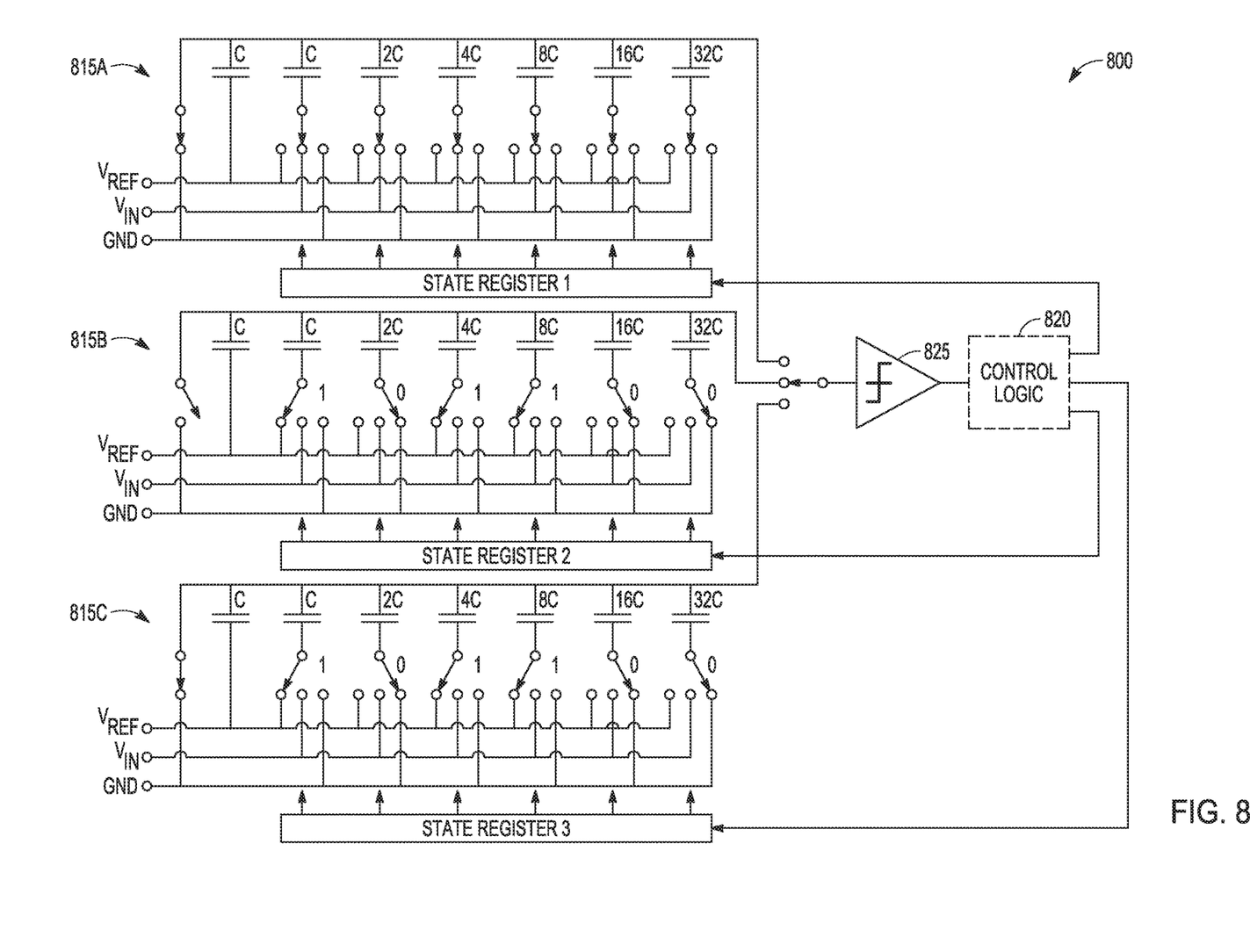
FIG. 8 is a diagram of an electronic circuit for processing analog signals.

FIG. 8 is a diagram of an electronic circuit 800 for processing analog signals. The electronic circuit includes multiple ADC circuits (815A-C) or sub-ADC circuits and performs A/D conversions using time-interleaving of the conversions by the multiple ADC circuits. Although the ADC circuits are shown to include single sided DAC circuits, the concepts can be applied to ADC circuit with differential DAC circuits. The electronic circuit 800 also includes control logic circuitry 820 that advances the ADC circuits through multiple time-interleaved conversions that include time-interleaved acquisition phases, conversion phases, and tracking phases. During an acquisition phase an ADC circuit samples the analog signal. During a conversion phase the ADC circuit converts the sampled analog signal to a digital value. The tracking phase precedes the acquisition phase. During the tracking phase the control logic circuitry is configured to update the capacitors of the ADC circuit with charge corresponding to the digital value of the most recent A/D conversion from a different ADC circuit before the ADC circuit returns to the acquisition phase.

Because the operation of the ADC circuits is interleaved, the control logic circuitry advances the phases of the ADC circuits so that an acquisition phase of any ADC circuit does not completely coincide with an acquisition phase of any other ADC circuit, and so that a conversion phase of any ADC circuit does not completely coincide with a conversion phase of any other ADC circuit. If only one ADC circuit is in a conversion phase at a time, the comparator circuit 825 can be shared among the ADC circuits 815A-C.

Although three ADC circuits are shown in FIG. 8, an implementation may include more than three ADC circuits. In some examples, the interleaving follows the phases shown in FIG. 4B with an added TRACKING phase inserted after a conversion phase and immediately preceding the acquisition phase of an ADC circuit. In some examples, the interleaving includes randomization as in FIG. 6B where the tracking operation is performed during the IDLE phase. The control logic circuitry 820 uses randomization to determine which ADC circuit of the multiple ADC circuits next begins a cycle of an acquisition phase, a conversion phase, and a tracking phase.

In some examples, more than one previous conversion can be used to determine the value to which to set the ADC circuit is set for the tracking operation. In certain examples the results of previous conversions are weighted. The control logic circuitry 820 may update the first ADC circuit during the tracking phase of the first ADC circuit using weighted A/D conversion information of N most recent A/D conversions, where N is a positive integer greater than one. In an example intended to be illustrative and non-limiting, N=3 and the control logic circuitry uses the A/D conversion information of the last 3 conversion to set the value for the current tracking phase of an ADC circuit. The control may weight (e.g., multiply) the last three conversions by 10%, 30%, and 60% to set the value of the current tracking phase.

According to some examples, the control logic circuitry may not update the ADC circuit with a complete A/D conversion from a different ADC circuit for the tracking operation. The A/D conversion may resolve the most significant bits (MSBs) of the A/D conversion first. Waiting for the last bits of the conversion may not reduce the kickback by an appreciable amount. The control logic circuitry 820 may update an ADC circuit with partial conversion A/D information by another ADC circuit. This may be useful to shorten the duration of the tracking phase.

In some examples, the value used for the tracking phase of an ADC circuit includes the most recent A/D conversion information by the different ADC circuit and a specified offset. The specified offset may be a digital pre-distortion digital value used to modify the conversion information. Randomization may be useful in determining values to use in the tracking operation or phase. In some examples, the control logic circuitry 820 may update an ADC circuit during the tracking phase and before the acquisition phase using the most recent A/D conversion information by another ADC circuit and a random digital value.

The tracking operation can be used to address the problem of dielectric absorption of capacitors that are fabricated using a material with a low dielectric constant (low-K capacitor). Dielectric absorption is an intrinsic property of a capacitor to recharge itself after being discharged. This can cause the capacitor array of a DAC circuit of an ADC circuit to exhibit somewhat of a "memory" of previously sampled input voltages. As a consequence, the dielectric absorption can limit the accuracy of an A/D conversion. The specified offset used for the tracking phase can be a pre-distortion digital value to counteract the recharge of the capacitors used in the ADC circuits. The dielectric absorption may vary with frequency. In some examples, control logic circuitry 820 sets the specified offset value, or pre-distortion digital value, according to the sampling time of the ADC circuits.

In some examples, a dedicated ADC circuit, separate from the ADCs circuit used in interleaving, is used to determine the specified offset value or a predistortion digital value. The control logic circuitry 820 updates the first ADC circuit during the tracking phase and before the acquisition phase by the first ADC circuit using the most recent A/D conversion information by the different ADC circuit and a digital value produced by the dedicated ADC circuit.

The interleaved ADC circuits described herein operate with reduced kickback due to sampling of the input signal. The interleaved ADC circuits can be used in an electronic data acquisition system, such as to acquire data from one or more sensors. The input to the ADC circuits can be differential or single-ended and can be electrically coupled to a buffer between the sensor and the ADC input to provide high impedance interface if necessary.

ADDITIONAL DESCRIPTION AND ASPECTS

Aspect 1 can include subject matter (such as an electronic circuit) comprising multiple analog-to-digital converter (ADC) circuits and control logic circuitry. The control logic circuitry advances the multiple ADC circuits through multiple time-interleaved conversions that include time-interleaved acquisition phases, conversion phases, and tracking phases. An acquisition phase of a first ADC circuit samples the analog signal, and a conversion phase of the first ADC circuit converts the sampled analog signal to a digital value. The control logic circuitry is configured to update the first ADC circuit with most recent A/D conversion information by a different ADC circuit during a tracking phase of the first ADC circuit before the acquisition phase of the first ADC circuit.

In Aspect 2, the subject matter of Aspect 1 optionally includes control logic circuitry configured to initiate an acquisition phase of any ADC circuit to not completely coincide with an acquisition phase of any other ADC circuit, and to initiate a conversion phase of any ADC circuit to not completely coincide with a conversion phase of any other ADC circuit.

In Aspect 3, the subject matter of one or both of Aspects 1 and 2 optionally includes control logic circuitry configured to update the first ADC circuit during the tracking phase with partial conversion A/D information of the most recent A/D conversion by the different ADC circuit.

In Aspect 4, the subject matter of one or any combination of Aspects 1-3 optionally includes multiple ADC circuits that are differential ADC circuits.

In Aspect 5, the subject matter of one or any combination of Aspects 1-4 optionally includes control logic circuitry configured to update the first ADC circuit during the tracking phase and before the acquisition phase by the first ADC circuit using the most recent A/D conversion information by the different ADC circuit and a specified offset before the acquisition phase by the first ADC circuit.

In Aspect 6, the subject matter of one or any combination of Aspects 1-5 optionally includes control logic circuitry configured to update the first ADC circuit during the tracking phase and before the acquisition phase by the first ADC circuit using the most recent A/D conversion information by the different ADC circuit and a pre-distortion digital value that updates the most recent conversion information.

In Aspect 7, the subject matter of Aspect 6 optionally includes control logic circuitry configured to determine the pre-distortion digital value according to a sampling time of the multiple ADC circuits.

In Aspect 8, the subject matter of one or any combination of Aspects 1-5 optionally includes control logic circuitry configured to update the first ADC circuit during the tracking phase and before the acquisition phase by the first ADC circuit using the most recent A/D conversion information by the different ADC circuit and a random digital value.

In Aspect 9, the subject matter of one or any combination of Aspects 1-4 optionally includes control logic circuitry configured to update the first ADC circuit during the tracking phase and before the acquisition phase by the first ADC circuit using the most recent A/D conversion information by the different ADC circuit and digital value produced by a dedicated ADC circuit separate from the multiple time-interleaving ADC circuits.

In Aspect 10, the subject matter of one or any combination of Aspects 1-4 optionally includes control logic circuitry configured to update the first ADC circuit during the tracking phase of the first ADC circuit using weighted A/D conversion information of N most recent A/D conversions, where N is a positive integer greater than one.

In Aspect 11, the subject matter of one or any combination of Aspects 1-10 optionally includes control logic circuitry configured to randomize which ADC circuit of the multiple ADC circuits next begins a cycle of an acquisition phase, a conversion phase, and a tracking phase.

Aspect 12 can include subject matter (such as a method processing an analog signal) or can optionally be combined with one or any combination of Aspects 1-11 to include such subject matter, comprising time-interleaving analog-to-digital (A/D) conversions performed using multiple analog-to-digital converter (ADC) circuits.

The time interleaving includes controlling each of the ADC circuits to perform an acquisition phase, a conversion phase, and a tracking phase. The acquisition phase of a first ADC circuit samples the analog signal, the conversion phase of the first ADC circuit converts the sampled analog signal to a digital value, and the tracking phase of the first ADC circuit configures the first ADC circuit using most recent conversion information by a different ADC circuit before the acquisition phase by the first ADC circuit.

In Aspect 13, the subject matter of Aspect 12 optionally includes an acquisition phase of any ADC circuit not completely coinciding with an acquisition phase of any other ADC circuit, and the conversion phase of any ADC circuit not completely coinciding with a conversion phase of any other ADC circuit.

In Aspect 14, the subject matter of one or both of Aspects 12 and 13 optionally includes the most recent conversion information being a partial A/D conversion performed by the different ADC circuit.

In Aspect 15, the subject matter of one or any combination of Aspects 12-14 optionally includes includes time-interleaving A/D conversions performed using multiple differential ADC circuits.

In Aspect 16, the subject matter of one or any combination of Aspects 12-15 optionally includes the tracking phase of the first ADC circuit configuring the first ADC circuit using most recent conversion information by a different ADC circuit and a specified offset before the acquisition phase by the first ADC circuit In Aspect 17, the subject matter of Aspect 16 optionally includes the specified offset including a pre-distortion digital value that updates the most recent conversion information.

In Aspect 18, the subject matter of Aspect 17 optionally includes the pre-distortion digital value being determined according to a sampling time of the multiple time-interleaving ADC circuits.

In Aspect 19, the subject matter of Aspect 16 optionally includes the specified offset including a random digital value that updates the most recent conversion information.

In Aspect 20, the subject matter of Aspect 16 optionally includes the specified offset being determined using a dedicated ADC circuit separate from the multiple time-interleaving ADC circuits.

In Aspect 21, the subject matter of one or any combination of Aspects 12-20 optionally includes the tracking phase of the first ADC circuit configures the first ADC circuit using weighted conversion information of N most recent A/D conversions, where N is a positive integer greater than one.

In Aspect 22, the subject matter of one or any combination of Aspects 12-21 optionally includes randomizing which ADC circuit of the multiple ADC circuits next begins a cycle of an acquisition phase, a conversion phase, and a tracking phase.

Aspect 23 can include subject matter (such as an interleaved successive approximation register (SAR) analog-to-digital converter (ADC) circuit) or can optionally be combined with one or any combination of Aspects 1-22 to include such subject matter, comprising multiple sub-ADC circuits, a comparator circuit, and control logic circuitry. Each sub-ADC circuit includes a digital-to-analog (DAC) circuit that includes weighted circuit components, and a switch circuit configured to sample an analog input signal for conversion. The comparator is configured to compare a voltage of one or more of the weighted components of the DAC circuits of the multiple sub-ADC circuits to the sampled analog input signal as part of a bit trial of an analog-to-digital (A/D) conversion of the sub-ADC circuits. The control logic circuitry is configured to advance the multiple sub-ADC circuits through multiple time-interleaved conversions that include time-interleaved acquisition phases, conversion phases, and tracking phases. An acquisition phase of a first sub-ADC circuit samples the analog input signal, and a conversion phase of the first sub-ADC circuit converts the sampled analog signal to a digital value using bit trials. The control logic circuitry is configured to update the first sub-ADC circuit with most recent A/D conversion information by a different sub-ADC circuit during a tracking phase of the first sub-ADC circuit before the acquisition phase of the first sub-ADC circuit.

In Aspect 24, the subject matter of Aspect 23 optionally includes control logic circuitry is configured to update the first ADC circuit during the tracking phase with partial conversion A/D information of the most recent A/D conversion by the different ADC circuit.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An electronic circuit comprising:
   multiple analog-to-digital converter (ADC) circuits;
   control logic circuitry configured to advance the multiple ADC circuits through time-interleaved acquisition phases, conversion phases, and tracking phases; and
   wherein an acquisition phase of a first ADC circuit samples the analog signal, a conversion phase of the first ADC circuit converts the sampled analog signal to a digital value, and the control logic circuitry is configured to update the first ADC circuit with most recent analog-to-digital (A/D) conversion information by a different ADC circuit during a tracking phase of the first ADC circuit before the acquisition phase of the first ADC circuit.

2. The electronic circuit of claim 1, wherein the control logic circuitry is configured to initiate an acquisition phase of any ADC circuit to not completely coincide with an acquisition phase of any other ADC circuit, and to initiate a conversion phase of any ADC circuit to not completely coincide with a conversion phase of any other ADC circuit.

3. The electronic circuit of claim 1, wherein the control logic circuitry is configured to update the first ADC circuit during the tracking phase with partial conversion A/D information of the most recent A/D conversion by the different ADC circuit.

4. The electronic circuit of claim 1, wherein the multiple ADC circuits are differential ADC circuits.

5. The electronic circuit of claim 1, wherein the control logic circuitry is configured to update the first ADC circuit during the tracking phase and before the acquisition phase by the first ADC circuit using the most recent A/D conversion information by the different ADC circuit and a specified offset before the acquisition phase by the first ADC circuit.

6. The electronic circuit of claim 1, wherein the control logic circuitry is configured to update the first ADC circuit during the tracking phase and before the acquisition phase by the first ADC circuit using the most recent A/D conversion information by the different ADC circuit and a pre-distortion digital value that updates the most recent conversion information.

7. The electronic circuit of claim 6, wherein the control logic circuitry is configured to determine the pre-distortion digital value according to a sampling time of the multiple ADC circuits.

8. The electronic circuit of claim 1, wherein the control logic circuitry is configured to update the first ADC circuit during the tracking phase and before the acquisition phase by the first ADC circuit using the most recent A/D conversion information by the different ADC circuit and a random digital value.

9. The electronic circuit of claim 1, wherein the control logic circuitry is configured to update the first ADC circuit during the tracking phase and before the acquisition phase by the first ADC circuit using the most recent A/D conversion information by the different ADC circuit and digital value produced by a dedicated ADC circuit separate from the multiple time-interleaving ADC circuits.

10. The electronic circuit of claim 1, wherein the control logic circuitry is configured to update the first ADC circuit during the tracking phase of the first ADC circuit using weighted A/D conversion information of N most recent A/D conversions, where N is a positive integer greater than one.

11. The electronic circuit of claim 1, wherein the control logic circuitry is configured to randomize which ADC circuit of the multiple ADC circuits next begins a cycle of an acquisition phase, a conversion phase, and a tracking phase.

12. A method of processing an analog signal, the method comprising:
   time-interleaving analog-to-digital (A/D) conversions performed using multiple analog-to-digital converter (ADC) circuits, including:
   controlling each of the ADC circuits to perform an acquisition phase, a conversion phase, and a tracking phase;
   wherein the acquisition phase of a first ADC circuit samples the analog signal, the conversion phase of the first ADC circuit converts the sampled analog signal to a digital value, and the tracking phase of the first ADC circuit configures the first ADC circuit using most recent conversion information by a different ADC circuit before the acquisition phase by the first ADC circuit.

13. The method of claim 12, wherein an acquisition phase of any ADC circuit does not completely coincide with an acquisition phase of any other ADC circuit, and the conversion phase of any ADC circuit does not completely coincide with a conversion phase of any other ADC circuit.

14. The method of claim 12, wherein the most recent conversion information is a partial A/D conversion performed by the different ADC circuit.

15. The method of claim 12, wherein the time-interleaving A/D conversions performed using multiple ADC circuits includes time-interleaving A/D conversions performed using multiple differential ADC circuits.

16. The method of claim 12, wherein the tracking phase of the first ADC circuit configures the first ADC circuit using most recent conversion information by a different ADC circuit and a specified offset before the acquisition phase by the first ADC circuit.

17. The method of claim 16, wherein the specified offset includes a pre-distortion digital value that updates the most recent conversion information.

18. The method of claim 17, wherein the pre-distortion digital value is determined according to a sampling time of the multiple time-interleaving ADC circuits.

19. The method of claim 16, wherein the specified offset includes a random digital value that updates the most recent conversion information.

20. The method of claim 16, wherein the specified offset is determined using a dedicated ADC circuit separate from the multiple time-interleaving ADC circuits.

21. The method of claim 12, wherein the tracking phase of the first ADC circuit configures the first ADC circuit using weighted conversion information of N most recent A/D conversions, where N is a positive integer greater than one.

22. The method of claim 12, including randomizing which ADC circuit of the multiple ADC circuits next begins a cycle of an acquisition phase, a conversion phase, and a tracking phase.

23. An interleaved successive approximation register (SAR) analog-to-digital converter (ADC) circuit, the SAR ADC circuit comprising:
multiple sub-ADC circuits, each sub-ADC circuit including:
a digital-to-analog (DAC) circuit that includes weighted circuit components; and
a switch circuit configured to sample an analog input signal for conversion;
a comparator circuit configured to compare a voltage of one or more of the weighted components of the DAC circuits of the multiple sub-ADC circuits to the sampled analog input signal as part of a bit trial of an analog-to-digital (A/D) conversion of the sub-ADC circuits;
control logic circuitry configured to advance the multiple sub-ADC circuits through time-interleaved acquisition phases, conversion phases, and tracking phases;
wherein an acquisition phase of a first sub-ADC circuit samples the analog input signal, a conversion phase of the first sub-ADC circuit converts the sampled analog signal to a digital value using bit trials, and the control logic circuitry is configured to update the first sub-ADC circuit with most recent A/D conversion information by a different sub-ADC circuit during a tracking phase of the first sub-ADC circuit before the acquisition phase of the first sub-ADC circuit.

24. The SAR ADC circuit of claim 23, wherein the control logic circuitry is configured to update the first ADC circuit during the tracking phase with partial conversion A/D information of the most recent A/D conversion by the different ADC circuit.

* * * * *